(12) United States Patent
Zhang et al.

(10) Patent No.: US 10,418,334 B2
(45) Date of Patent: Sep. 17, 2019

(54) SEMICONDUCTOR DEVICE INCLUDING CORNER RECESS

(71) Applicant: SANDISK SEMICONDUCTOR (SHANGHAI) CO., LTD., Shanghai (CN)

(72) Inventors: Hang Zhang, Shanghai (CN); Weili Wang, Shanghai (CN); Junrong Yan, Shanghai (CN); Kim Lee Bock, Shanghai (CN); Chee Keong Chin, Shanghai (CN); Chong Un Tan, Shanghai (CN); Xin Tian, Shanghai (CN)

(73) Assignee: SanDisk Semiconductor (Shanghai) Co. Ltd., Shanghai (CN)

(*) Notice: Subject to any disclaimer, the term of this patent is extended or adjusted under 35 U.S.C. 154(b) by 0 days.

(21) Appl. No.: 15/630,666

(22) Filed: Jun. 22, 2017

(65) Prior Publication Data

US 2018/0174983 A1 Jun. 21, 2018

(30) Foreign Application Priority Data

Dec. 20, 2016 (CN) .......................... 2016 1 1187693

(51) Int. Cl.
*H01L 21/304* (2006.01)
*H01L 23/00* (2006.01)
(Continued)

(52) U.S. Cl.
CPC ............ *H01L 23/562* (2013.01); *H01L 21/78* (2013.01); *H01L 25/0657* (2013.01);
(Continued)

(58) Field of Classification Search
CPC ...................... H01L 21/02035; H01L 21/8221
(Continued)

(56) References Cited

U.S. PATENT DOCUMENTS 6,638,691 B2 * 10/2003 Kang ...................... H01L 43/12
257/E43.006
7,648,891 B2 * 1/2010 Farooq .............. H01L 21/67092
257/E21.602
(Continued)

FOREIGN PATENT DOCUMENTS

CN 101297394 10/2008
CN 103568139 2/2014
(Continued)

OTHER PUBLICATIONS

English language Abstract for CN103568139 published Feb. 12, 2014.
(Continued)

*Primary Examiner* — George R Fourson, III
(74) *Attorney, Agent, or Firm* — Vierra Magen Marcus LLP (57) ABSTRACT

A semiconductor die is disclosed including corner recesses to prevent cracking of the semiconductor die during fabrication. Prior to dicing the semiconductor die from the wafer, recesses may be formed in the wafer at corners between any pair of semiconductor die. The recesses may be formed by a laser or photolithographic processes in the kerf area between semiconductor die. Once formed, the corner recesses prevent cracking and damage to semiconductor die which could otherwise occur at the corners of adjacent semiconductor die as the adjacent semiconductor die move relative to each other during the backgrind process.

16 Claims, 10 Drawing Sheets

(51) Int. Cl.
*H01L 25/065* (2006.01)
*H01L 21/78* (2006.01)
*H01L 21/683* (2006.01)

(52) U.S. Cl.
CPC .. *H01L 21/6836* (2013.01); *H01L 2221/6834* (2013.01); *H01L 2221/68327* (2013.01); *H01L 2221/68377* (2013.01)

(58) Field of Classification Search
USPC ........................................................ 257/777
See application file for complete search history.

(56) References Cited

U.S. PATENT DOCUMENTS

| | | | | |
|---|---|---|---|---|
| 8,470,640 | B2* | 6/2013 | Takiar | H01L 24/85 |
| | | | | 257/E21.499 |
| 8,940,618 | B2* | 1/2015 | Hwang | H01L 21/78 |
| | | | | 438/460 |
| 2005/0287713 | A1* | 12/2005 | Lin | H01L 21/4846 |
| | | | | 438/124 |
| 2008/0012096 | A1* | 1/2008 | Sin | H01L 21/78 |
| | | | | 257/620 |
| 2009/0098712 | A1* | 4/2009 | Taguchi | H01L 21/3083 |
| | | | | 438/462 |
| 2013/0069205 | A1* | 3/2013 | Ning | H01L 21/78 |
| | | | | 257/620 |
| 2015/0235973 | A1* | 8/2015 | Abe | H01L 24/06 |
| | | | | 257/48 |
| 2016/0211219 | A1* | 7/2016 | Buydens | H01L 21/78 |
| 2016/0233175 | A1* | 8/2016 | Dubey | H01L 23/562 |

FOREIGN PATENT DOCUMENTS

| | | | | |
|---|---|---|---|---|
| JP | 05136261 | A | * 6/1993 | |
| JP | 2009099681 | A | * 5/2009 | ......... H01L 21/3083 |

OTHER PUBLICATIONS

English language Abstract for CN101297394 published Oct. 29, 2008.

* cited by examiner

SEMICONDUCTOR DEVICE INCLUDING CORNER RECESS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Semiconductor memory may be provided within a semiconductor package, which protects the semiconductor memory and enables communication between the memory and a host device. Examples of semiconductor packages include system-in-a-package (SiP) or multichip modules (MCM), where a plurality of die are mounted and interconnected on a small footprint substrate.

Semiconductor die are typically batch processed together in a semiconductor wafer. Once the integrated circuits have been defined on the individual die, the die are diced from the wafer and removed for mounting within a package. Stealth dicing before grinding (occasionally referred to herein as "SDBG") is an emerging dicing technology, where laser pulses are focused between the top and bottom surfaces of the wafer in rows and columns defining the outlines of the individual semiconductor die. Subsequent mechanical perturbations, such as occur during the wafer background process, cause the wafer to fracture cleanly along the rows and columns defining the semiconductor die outlines.

While SDBG offers certain process efficiencies, SDBG has one disadvantage in that it may lead to cracking of the individual semiconductor die at the corners. In particular, during the mechanical backgrind process, where the grinding wheel passes over individual semiconductor die which have already been separated, the die can crash into each other, at times causing chipping or cracking at the corners. While the die are mounted on a tape during the backgrind process, the tape allows a small measure of movement between the die, and this small movement may be enough to result in the chipping and cracking described above.

DETAILED DESCRIPTION

The present technology will now be described with reference to the figures, which in embodiments, relate to a semiconductor die formed with corner recesses to prevent cracking or chipping of the semiconductor die during die fabrication. Prior to dicing the semiconductor die from the wafer, recesses may be formed in the wafer at corners between two or more semiconductor die. The recesses may be formed by a laser or photolithographic processes in the kerf area between semiconductor die. Once formed, the corner recesses prevent cracking or other damage to semiconductor die, for example as the adjacent semiconductor die move relative to each other during the backgrind process.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
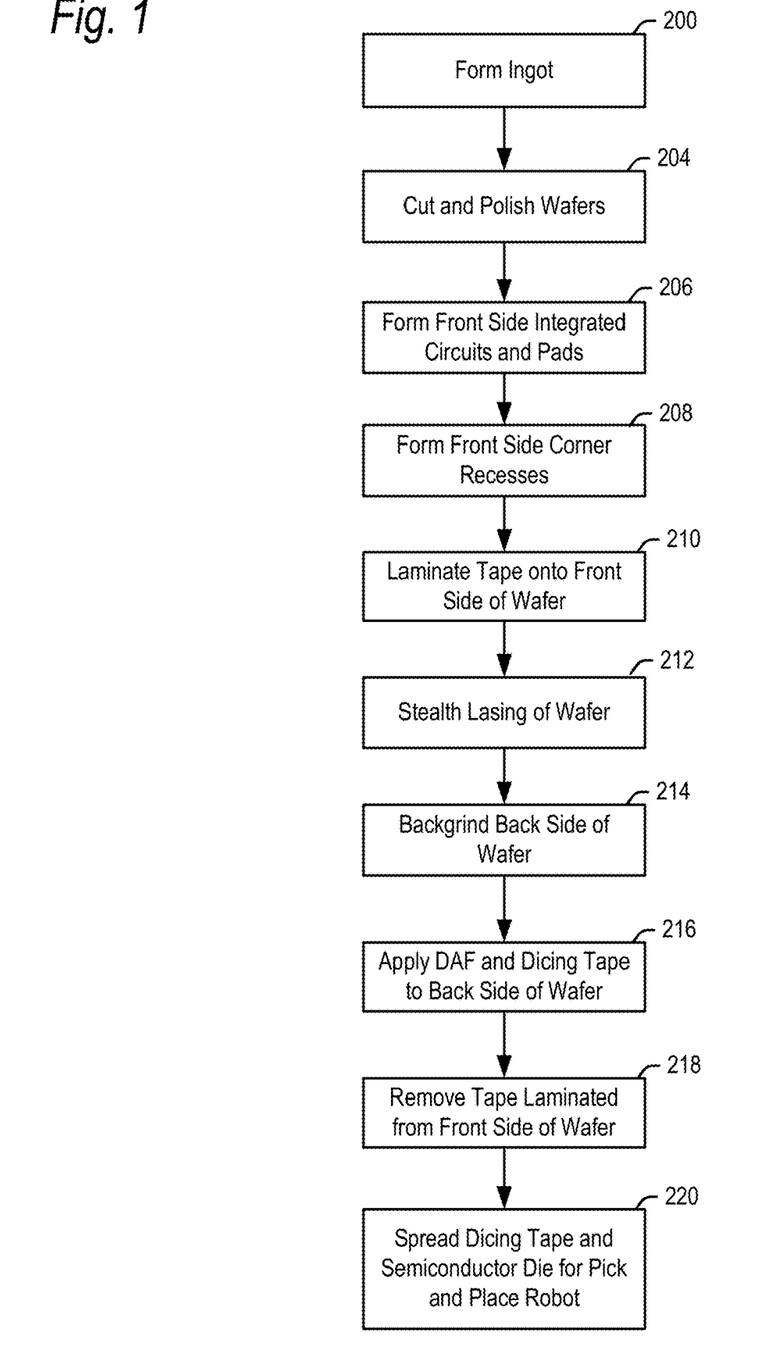
FIG. 1 is a flowchart for forming a semiconductor die according to embodiments of the present technology.

An embodiment of the present technology will now be explained with reference to the flowchart of FIG. 1, and the views of FIGS. 2-13. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 (FIG. 7) opposite surface 102, to provide smooth parallel surfaces. In step 206, the first major surface 102 may undergo various processing steps to divide the wafer 100 into respective semiconductor die 106 (one of which is numbered in FIGS. 2 and 3), and to form integrated circuits of the respective semiconductor die 106 on and/or in the first major surface 102. These various processing steps may include metallization steps depositing metal contacts for transferring signals to and from the integrated circuits. The electrical contacts may include die bond pads 108 (one of which is numbered in FIGS. 2 and 3) exposed on the first major surface 102.

Figure 2:
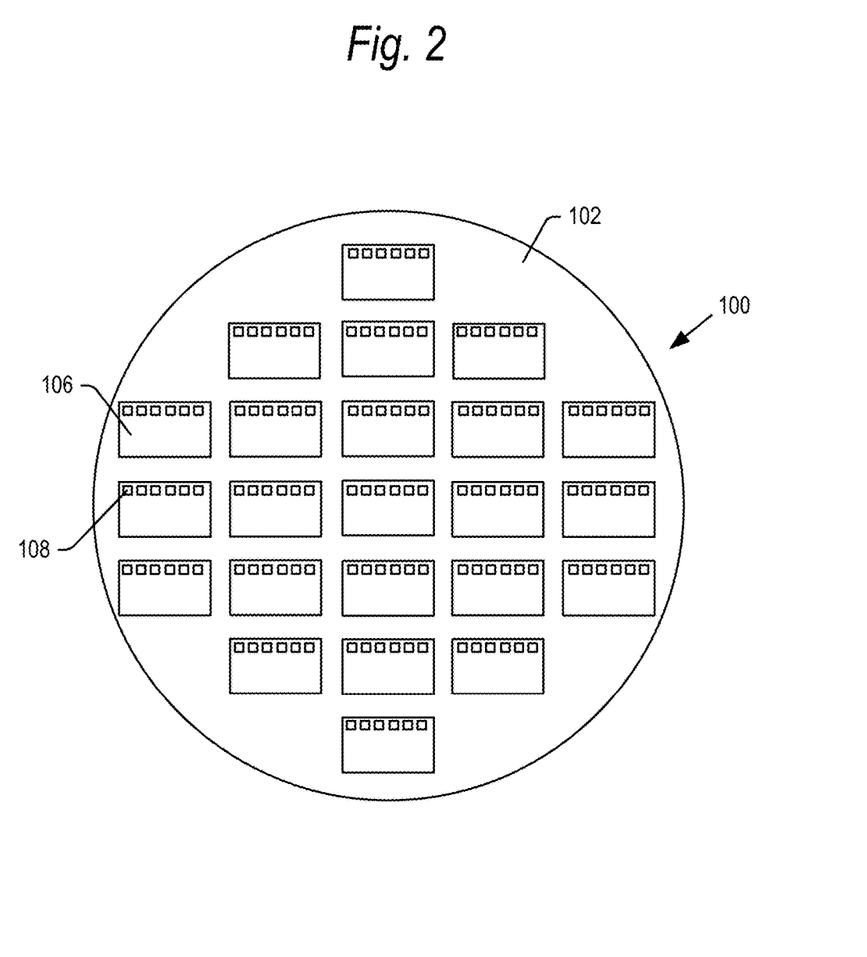
FIG. 2 is a front view of a semiconductor wafer showing a first major surface of the wafer.
Figure 3:
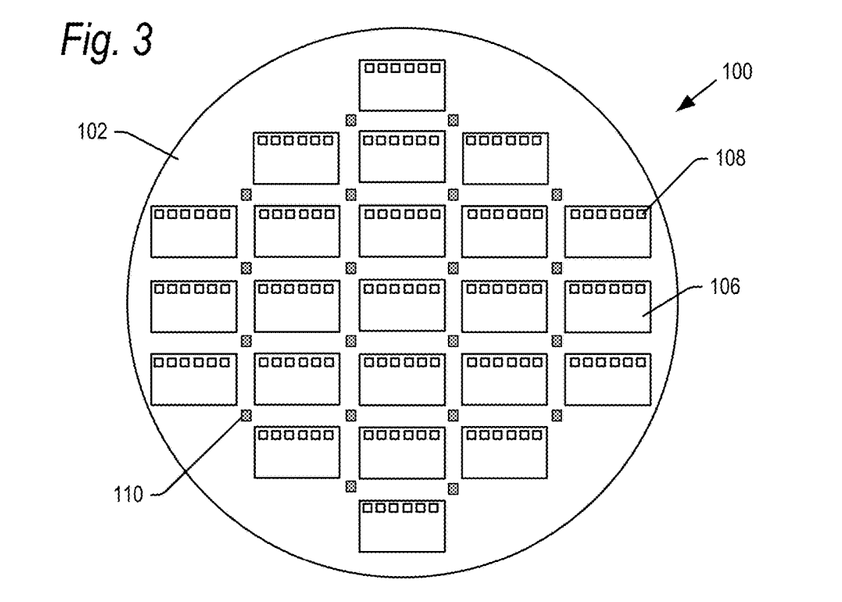
FIG. 3 is a front view of a semiconductor wafer including corner recesses according to embodiments of the present technology.

The number of semiconductor die 106 shown on wafer 100 in FIGS. 2 and 3 is for illustrative purposes, and wafer 100 may include more semiconductor die 106 than are shown. Similarly, the number of bond pads 108 shown on each semiconductor die 106 on wafer 100 in FIGS. 2 and 3 is for illustrative purposes, and each die 106 may include more die bond pads than are shown. The die bond pads 108 may for example be formed of aluminum, or alloys thereof, but the pads 108 may be formed of other materials in further embodiments. In embodiments, the integrated circuits may operate as NAND flash memory semiconductor die, though other types of integrated circuits are contemplated.

In accordance with aspects of the present technology, after the integrated circuits and contact pads of the semiconductor die 106 have been formed, recesses 110 (one of which is numbered in FIG. 3) may be formed at the corner of any two adjacent semiconductor die 106 in step 208. In particular, a recess 110 may be formed at the corner of any semiconductor die 106 which is horizontally, vertically and/or diagonally adjacent another semiconductor die 106 and wafer 100. In further embodiments, a recess 110 may be formed around all four corners of every semiconductor die 106, regardless of whether there is another adjacent semiconductor die. The corner recesses 110 may be formed in major surface 102, i.e., the same surface within which the integrated circuits of die 106 are formed.

Figure 4:
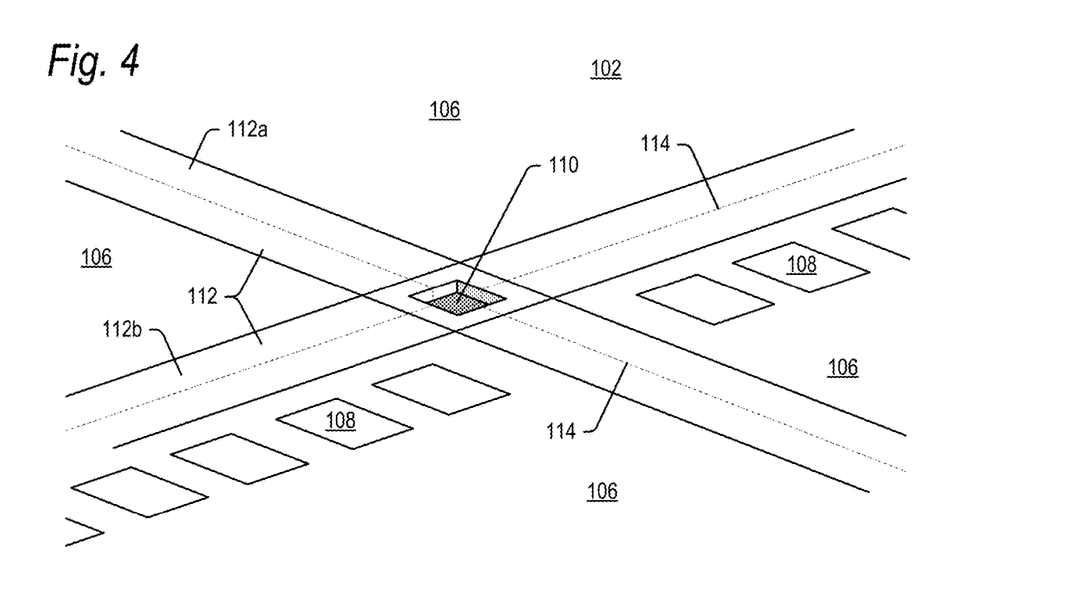
FIG. 4 is an enlarged view showing a corner recess according to embodiments of the present technology.

FIG. 4 is an enlarged view of a corner recess 110 between four adjacent semiconductor die 106. The following description may also apply to the other corner recesses 110 in wafer 100. The wafer 100 includes a kerf area 112 comprising vertically oriented kerf lines 112a and horizontally oriented kerf lines 112b. The kerf area 112 is reserved as a boundary around active areas of the semiconductor die where a cut may be made to separate the semiconductor die from each other and the wafer 100. As such, the kerf area 112 does not form part of the active area of semiconductor die 106 usable to form integrated circuits. The corner recesses 110 are formed within the kerf area 112, at intersections between the vertical and horizontal kerf lines 112a, 112b.

In some traditional dicing techniques such as sawing, material is removed from the wafer during the cut, and the cut is also not precisely controllable. As such, the kerf area 112 is traditionally larger than the area required to make the actual cut. Some wafer fabrication technologies provide for example a 70 μm kerf line width, while other wafer fabrication technologies provide for example a 170 μm kerf line width. The kerf lines 112a, 112b may have these or other widths in different embodiments.

As explained below, embodiments of the present technology use stealth dicing before grinding, which is a precise cutting method that removes little or none of the wafer when dicing the wafer. FIG. 4 further shows vertical and horizontal SDBG separation lines 114 indicating the dicing lines along which die 106 will be cut from wafer 100 using SDBG. As shown, the die 106 will be cut so that portions of the kerf lines 112a, 112b remain as a border around each semiconductor die. Additionally, as shown, the SDBG separation lines may bisect the corner recess 110 (though they may not evenly bisect the corner recess 110 in further embodiments). Thus, the four die 106 shown in FIG. 4 will each have a portion of the recess 110 upon dicing from the wafer 100 as explained below.

Figure 14:
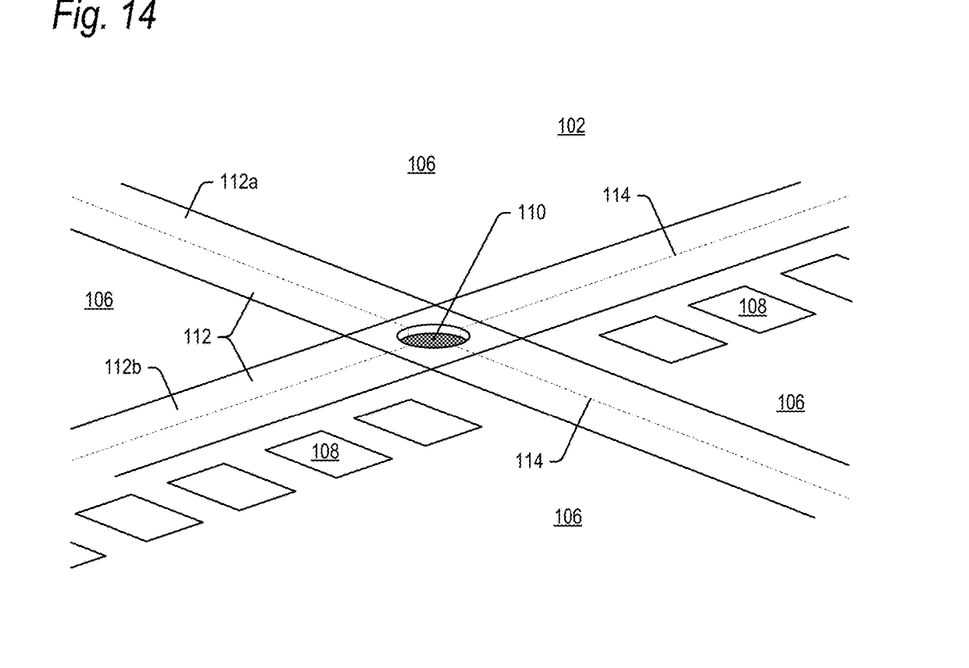
FIG. 14 is an enlarged view showing a corner recess according to an alternative embodiment of the present technology.

In embodiments, the corner recess 110 may have a square shape, but the recess 110 may have other shapes. For example, FIG. 14 shows an embodiment where the recess 110 is circular. Other shapes are contemplated. The corner recess 110 may have a length and width which is smaller than the area defined by the intersection of kerf lines 112a, 112b. For example, the corner recess 110 may have a length, width or diameter of 25 μm to 60 μm. It is understood that the length, width or diameter of the corner recess 110 may be less than 25 μm or greater than 60 μm in further embodiments. In embodiments, the corner recess 110 may take up the entire area defined by the intersection of the kerf lines 112a, 112b.

Before the backgrind step explained below, the wafer 100 may have a thickness between major surfaces 102, 104 of about 780 μm. The corner recess may be formed to a depth of 50 μm to 100 μm into the major surface 102 of wafer 100. After the backgrind step, the wafer 100 may have a thickness of for example 25 μm to 36 μm. As this final thickness is less than the depth of the corner recess 110, the backgrind process may remove all of the wafer material at the bottom of the recess 110 (in effect converting the recess 110 into a notch at corners of the die 106). However, it is understood that the depth of the recess 110 may be less than 50 μm or greater than 100 μm in further embodiments. Additionally, as explained below, the depth of recess 110 may be less than the final thickness of the wafer 100 after thinning in further embodiments.

Figure 5:
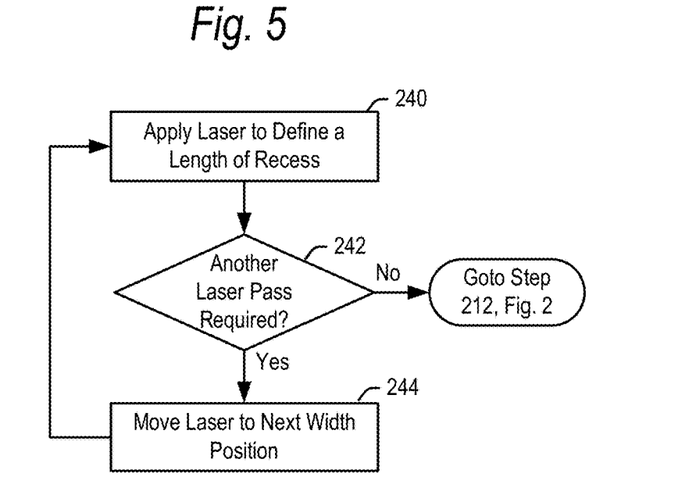
FIGS. 5 and 6 are flowcharts illustrating methods for forming the corner recesses according to different embodiments of the present technology.

The corner recess 110 shown in FIG. 4 may be formed by different processes, some of which will now be explained with reference to the flowcharts of FIGS. 5 and 6. Referring initially to FIG. 5, the corner recess 110 may be formed in step 208 using a laser, such as for example a laser saw model DFL 7160 from Disco Corporation, Tokyo, Japan. The recess 110 may be formed by other types of lasers in further embodiments. In step 240, the laser may be energized and moved in a first direction (for example vertically parallel to kerf line 112a) to define a first portion of the length of the recess 110. The diameter of the laser may be narrower than the width of the recess 110. Thus, if further passes of the laser are required in step 242 to fill out the width of the recess 110, the laser is shifted in a second direction (for example horizontally parallel to kerf line 112b), and the laser is again energized to move along the length of the recess 110.

As one non-limiting example, the recess 110 may have a length and width of 50 μm×50 μm, and the laser cut diameter may be 20 μm. In such an example, the laser may fully form the recess 110 in three, partially overlapping passes. In one embodiment, the laser may be a 2.2 W power laser, which moves at 60 mm/s and operates at a frequency of 100 kHz. These parameters are by way of example only, and each parameter may vary in further embodiments.

Figure 6:
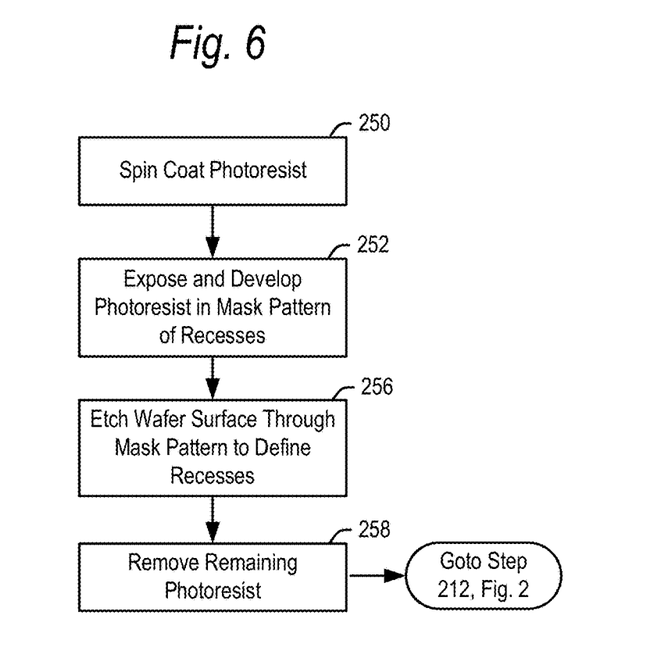

FIG. 6 illustrates a further process of step 208, where the recess 110 is formed by photolithography. In step 250, a layer of photoresist is spin coated onto the major surface 102. In step 252, the photoresist layer may be exposed and developed to form a mask pattern defining the positions of the corner recesses 110 on the wafer 100, using the known positions and borders of the semiconductor die 106 on the wafer. In step 256, the wafer surface 102 may be etched through the mask pattern to define the recesses 110. In step 258 the remaining photoresist may be chemically removed.

In the above description, the corner recesses 110 were defined in the surface of wafer 100 after the formation of the integrated circuits in major surface 102. In further embodiments, it is conceivable that the recesses 110 may be formed prior to formation of the integrated circuits in surface 102. For example, the steps of FIGS. 5 and 6 described above may be performed before formation of the integrated circuits. Once the steps of FIGS. 5 and 6 have been completed, the integrated circuits may be formed in surface 102 as described above.

After formation of the corner recesses 110, a layer of tape may be laminated onto the major surface 102 in step 210. The wafer 100 may then be turned over, and diced in step 212. As noted, embodiments of the present technology dice the wafer 100 using a stealth dicing before grinding step, which will now be explained with reference to FIGS. 7 and 8. The wafer 100 may be supported on a chuck or other support surface (not shown) with the second major surface 104 facing way from the support surface. A laser 120 may then emit a pulsed laser beam 122 at a wavelength that transmits through the second major surface 104 of the wafer 100, for example at infrared or near-infrared wavelengths. The pulsed laser beam may be focused to a point beneath the wafer's surface 104 using an optical system, for example including one or more collimating lenses 126. When the laser beam hits a peak power density at the focal point, the wafer absorbs the energy, and a pinpoint hole 130 is created beneath the wafer's surface.

Figure 7:
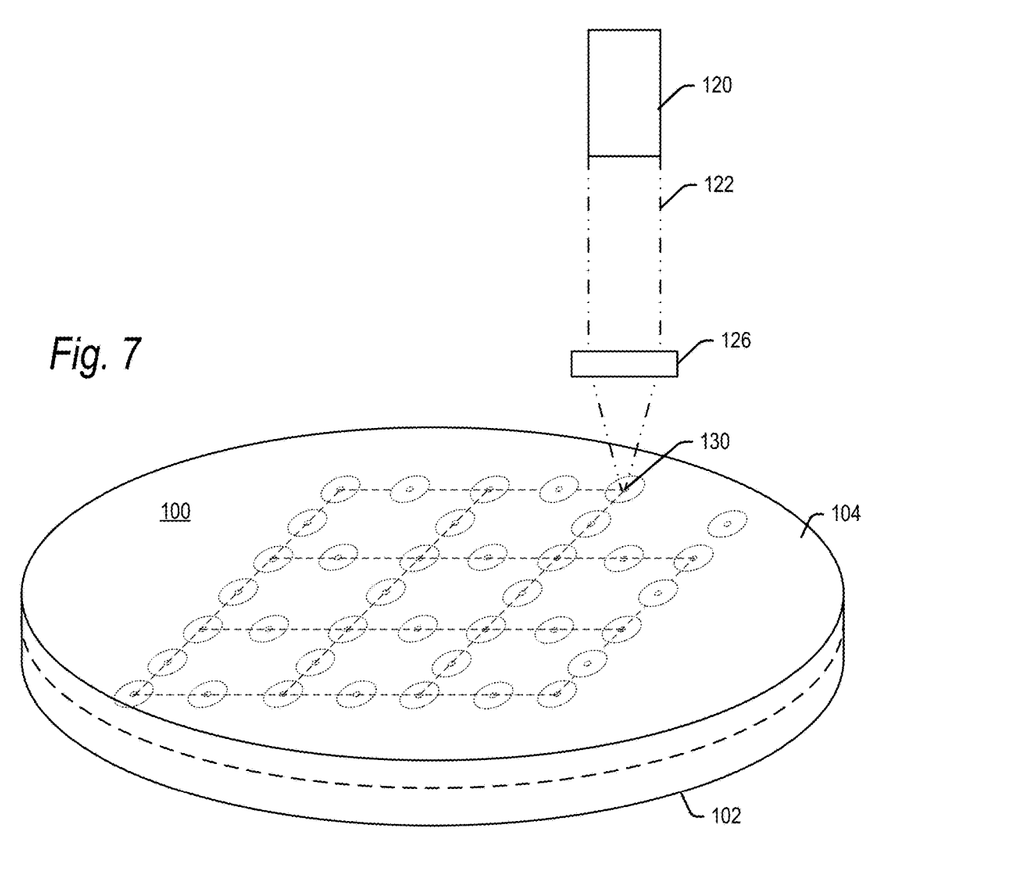
FIGS. 7 and 8 illustrate a stealth dicing before grinding laser process for dicing a semiconductor wafer.
Figure 8:
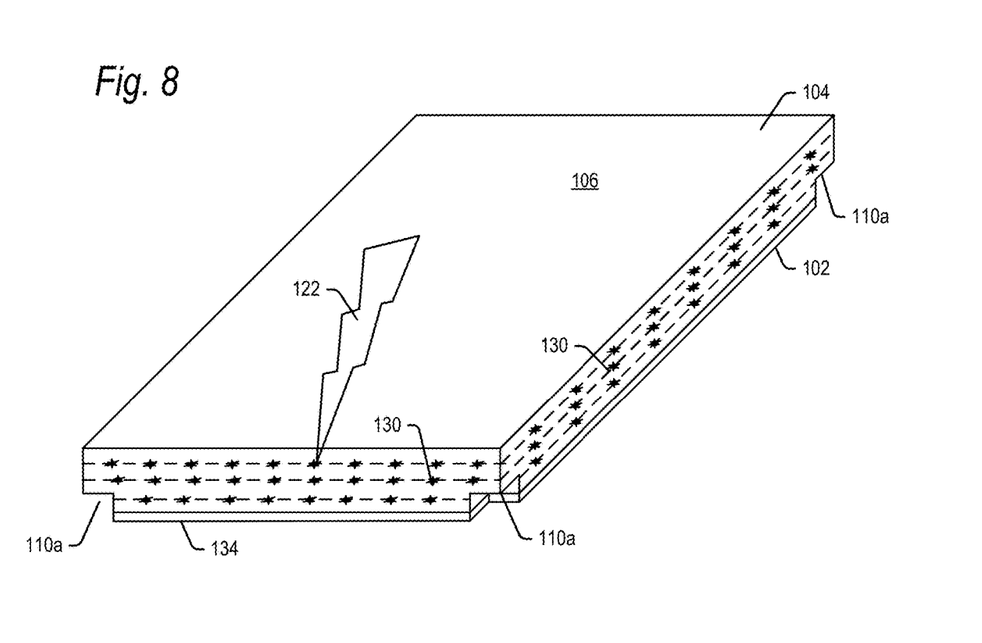

The laser may be moved along the kerf lines 112a and 112b in a plane of the wafer and activated at a number of points so that a number of closely situated pinpoint holes 130 are formed at an intermediate depth of the wafer (between the first and second major surfaces 102, 104 of the wafer). The rows and columns of pinpoint holes 130 define the eventual shape of each semiconductor die 106 to be diced from wafer 100 as indicated by FIGS. 7 and 8. The laser may form multiple layers of pinpoint holes 130 at multiple depths as shown in FIG. 8, but there may be larger or smaller number of layers in further embodiments. While FIG. 8 appears to show a diced semiconductor die 106, the die 106 may still be part of wafer 100 while the stealth lasing process is performed (and pinpoint holes 130 would not in fact be visible to the eye when inspecting wafer 100).

FIG. 8 shows recess portions 110a, which are the portions of the corner recesses 110 formed at the corners of an individual semiconductor die 106 after dicing. In particular, the laser 120 may be applied so that the horizontal and vertical pinpoint holes 130 vertically and horizontally bisect the corner recesses 110 in the wafer 100 along SDBG separation lines 114. Thus, upon dicing, recess portions 110a of the corner recesses 110 may be formed at one or more of the corners of each individual semiconductor die 106. FIG. 8 further shows an integrated circuit layer 134 including the integrated circuits formed at the first major surface 102 of the wafer 100.

Figure 9:
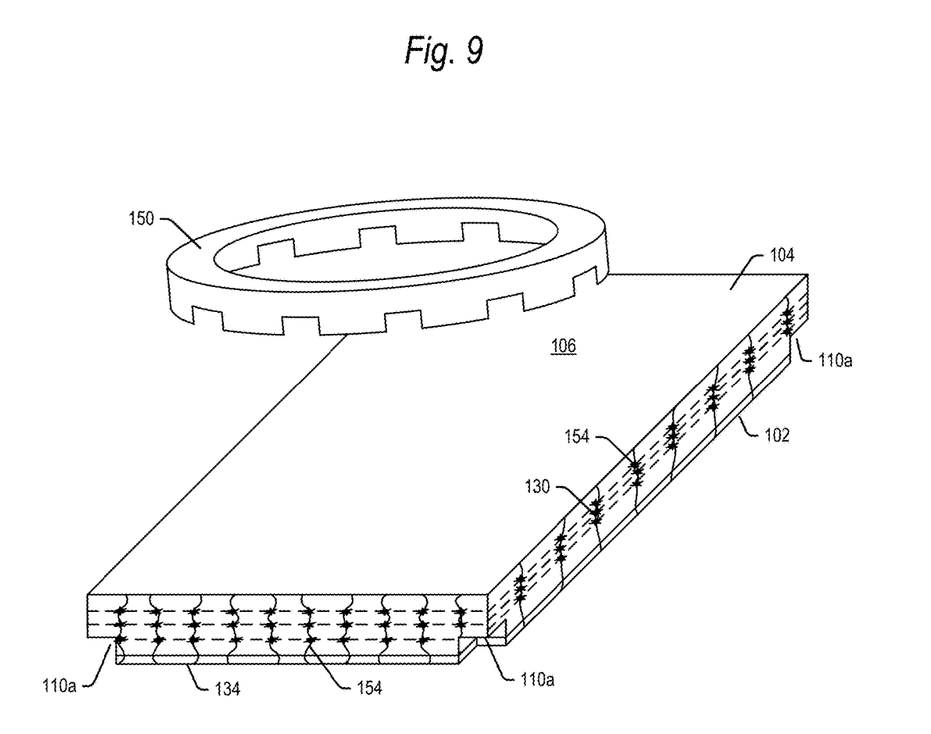
FIG. 9 illustrates a backgrind process for thinning a semiconductor wafer and separating individual die from the wafer.

After the stealth lasing step 212, the wafer 100 may be complete diced, or one or more semiconductor die 106 still be affixed together. The wafer may then be thinned in step 214 using a grinding wheel 150 (FIG. 9) applied to the second major surface 104. The grinding wheel 150 may thin the wafer 100 from, for example, 780 µm to its final thickness of for example about 25 µm to 36 µm. It is understood that the wafer 100 may be thinner or thicker than this range after the backgrind step in further embodiments. As shown in FIG. 9, in addition to thinning the wafer 100, the vibrations from the backgrind step may cause cracks 154 at the pinpoint holes 130 to propagate toward the first and second major surfaces 102, 104 of the wafer 100 to complete the dicing of any die along SDBG separation lines 114 that may have remained connected after stealth lasing step 212. It is noted that these cracks 154 are intended (in order to dice the individual die 106 from the wafer 100), and are not the problematic corner cracks addressed by the present technology.

Figure 10:
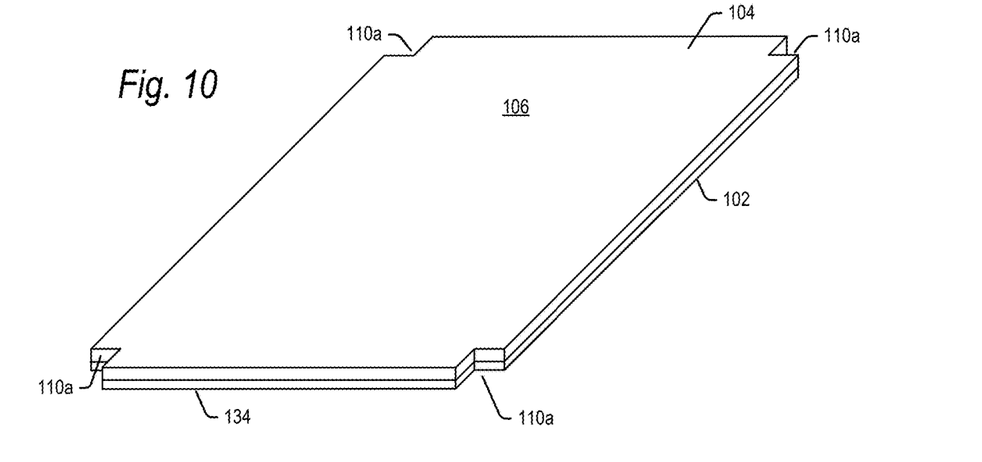
FIGS. 10 and 11 illustrate alternative embodiments of a semiconductor die within a wafer after the stealth dicing before grinding and backgrind processes.
Figure 11:
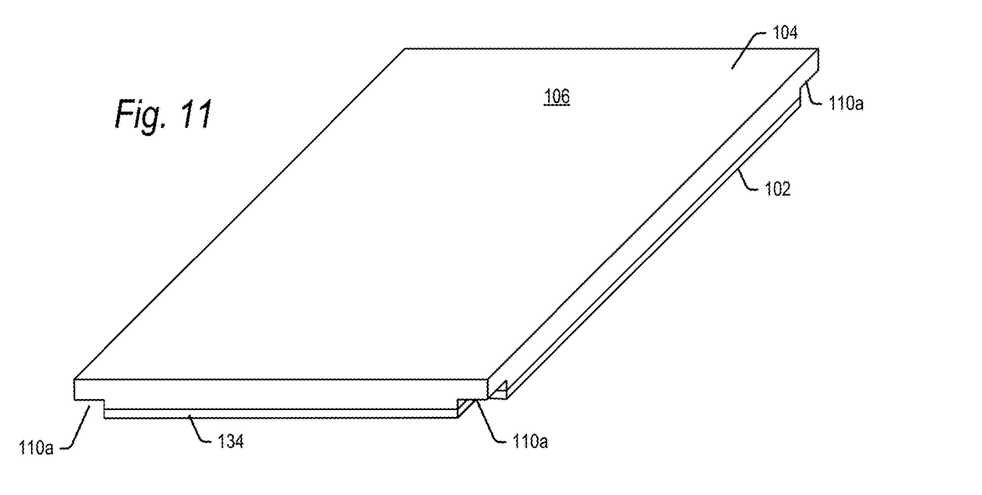

FIGS. 10 and 11 show alternative embodiments of a semiconductor die 106 within wafer 100 thinned to its final thickness after the backgrind step 214. In FIG. 10, the depth of the corner recesses 110 formed in wafer 100 is greater than the final thickness of the wafer 100. As such, after thinning, the recess portions 110a are full depth (i.e., notches in the corners of the semiconductor die 106). As noted above, where individual semiconductor die 106 are fully separated from each other before completion of the backgrind step 214, the perturbations of the backgrind step may cause corners of adjacent semiconductor die to move relative to each other. This movement has caused crashing, cracking and/or chipping at the corners of conventional semiconductor die as explained in the Background section. However, formation of the corner recesses 110 and recess portions 110a in the semiconductor die prevents die from crashing into or contacting each other at the corners upon such relative movement. Thus, the corner recesses 110 and recess portions 110a are effective in preventing chipping and/or cracking at the corners of semiconductor die, thus improving semiconductor die yields.

While full depth recess portions 110a may be preferable, it is conceivable that the depth of the corner recesses 110 formed in the wafer 100 may be less than the final thickness of the wafer 100. Such an embodiment is shown in FIG. 11. In this embodiment, the recess portions 110a are formed in respective semiconductor die 106 at the first major surface 102 including the layer of integrated circuits 134. After thinning, no recess portions 110a exist at the second major surface 104. Thus, crashing of the corners of respective semiconductor die 106 may occur at the second major surface 104. However, as the recess portions 110a exist at the first major surface 102 including the layer of integrated circuits 134, the integrated circuits are protected.

After completion of the backgrind step 214, a layer of die attach film (DAF) adhered to a flexible dicing tape may be applied to a second major surface 104 of the wafer 100 in step 216. The wafer 100 may then be turned over and supported on a chuck or other support surface, and the lamination tape on the first major surface 102 of the wafer 100 may be removed in step 218. Once on the chuck, the flexible dicing tape may be stretched along orthogonal axes to separate the individual semiconductor die 106 in step 220 to allow the individual semiconductor die 106 to be removed by a pick and place robot for inclusion in a semiconductor package. It is conceivable that the die 106 are not fully diced at completion of the backgrind step 214. In this event, stretching of the dicing tape in step 220 will complete dicing of the semiconductor die along the SDBG separation lines 114.

Figure 12:
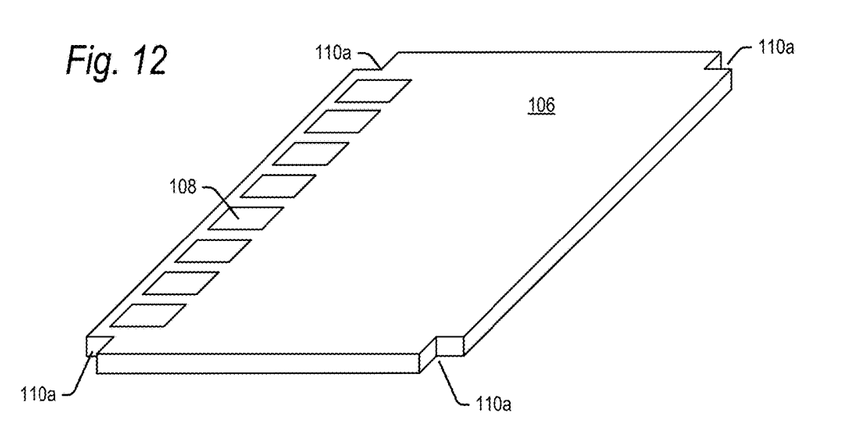
FIG. 12 illustrates a perspective view of a semiconductor die fabricated according to embodiments of the present technology.

FIG. 12 shows a semiconductor die 106 after separation from wafer 100. The recess portions 110a are shown in four corners of the semiconductor die 106. As noted above, recess portions 110a may alternatively be formed in one, two or three corners of the semiconductor die 106.

Figure 13:
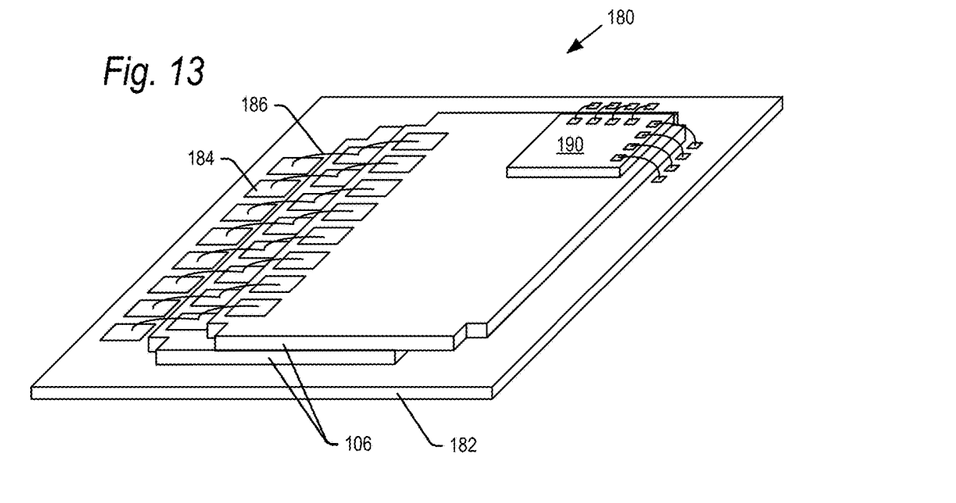
FIG. 13 is a semiconductor package including a semiconductor die fabricating according to embodiments of the present technology.

FIG. 13 shows a semiconductor package 180 including a stack of semiconductor die 106 formed according to the present technology. The stack is shown as including a pair of semiconductor die 106, but the stack may include more than two semiconductor die 106 in further embodiments, including for example four, eight, sixteen, thirty-two and sixty-four semiconductor die. The semiconductor die are shown mounted on a substrate 182, though the semiconductor die be formed in a chip scale package without a substrate in further embodiments. The bond pads 108 of the semiconductor die 106 are shown wire bonded to contact pads 184 of the substrate 182 via wire bonds 186. The semiconductor die 106 may alternatively be formed with an array of die bond pads 108, which get directly mounted to a like array of contact pads on substrate 182 in a flip-chip configuration. In embodiments, the semiconductor package 180 may further include a controller die 190, such as an ASIC, mounted on top of the semiconductor die stack (as shown) or mounted directly to the substrate. The controller die 190 may be wire bonded to the substrate or electrically connected by other means. The semiconductor package 180 may be encapsulated in molding compound (not shown) to complete the package.

In embodiments described above, the semiconductor die 106 may be formed with recess portions 110a to prevent cracking of the semiconductor die during SDBG and subsequent backgrind processes. However, it is conceivable that the semiconductor die 106 may be formed with recess portions 110a as described above to prevent cracking of the semiconductor die at the corners during other die or package fabrication processes. In such embodiments, the wafer 100 may be diced by techniques other than SDBG, such as blade or waterjet cutting, performed before or after the backgrind step.

In summary, an example of the present technology relates to a semiconductor wafer comprising: a first major surface; a second major surface opposed to the first major surface; a plurality of semiconductor die comprising integrated circuits formed in the first major surface of the wafer, in active areas of the semiconductor die; a kerf area comprising first and second sets of kerf lines surrounding the active areas of the plurality of semiconductor die; and a plurality of corner recesses formed into the first major surface of the wafer, at intersections of the first and second sets of kerf lines.

In a further example, the present technology relates to a semiconductor die formed from a semiconductor wafer, the semiconductor die comprising: a first major surface; a second major surface opposed to the first major surface, wherein the second major surface includes an active area and a border; an active area including integrated circuits; and one or more recess portions formed within the border and at one or more corners where sides of the semiconductor die come together, the one or more recess portions provided to prevent damage to the semiconductor die within the active area.

In a further example, the present technology relates to a semiconductor package, comprising: two or more stacked memory die, a semiconductor die of the stacked memory die comprising: a first major surface, a second major surface opposed to the first major surface, an active area including integrated circuits, the integrated circuits formed at the first major surface, a border, around the active area, devoid of integrated circuits, and one or more recess portions formed within the border and at one or more corners where sides of the semiconductor die come together, the one or more recess portions provided to prevent damage to the semiconductor die within the active area; and a controller die electrically connected to the stacked memory die for controlling the transfer of data to and from the stacked memory die.

In a further example, the present technology relates to a method of fabricating a plurality of semiconductor die within a wafer, the method comprising: (a) defining positions of the plurality of semiconductor die on the wafer; (b) forming a plurality integrated circuits at a first major surface of the wafer, and within active areas of the plurality of semiconductor die; (c) forming a plurality of recesses at boundaries between the active areas and at corners between adjacent active areas; (d) dicing the plurality of semiconductor die to at least partially separate the plurality of semiconductor die from the wafer, a portion of a recess of the plurality of recesses being positioned at a corner of a semiconductor die of the plurality of semiconductor die; and (e) backgrinding the plurality of semiconductor die, the portion of the recess at the corner of the semiconductor die preventing other semiconductor die from contacting the corner of the semiconductor die.

In a further example, the present technology relates a semiconductor die fabricated within a wafer, the semiconductor die comprising: a plurality integrated circuits formed at a first major surface of the wafer, and within an active area of the semiconductor die; and a recess means located at a corner of the semiconductor die, the recess preventing other semiconductor die from contacting the corner of the semiconductor die during fabrication of the semiconductor die.

In a further example, the present technology relates to a semiconductor die comprising: first and second surfaces spaced apart by a first thickness; integrated circuits formed in an active area between the first and second surfaces; edges defined around a perimeter between the first and second surfaces; and corners defined between adjacent edges, at least one of the corners being recessed to a second thickness.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer comprising:
    a first major surface;
    a second major surface opposed to the first major surface;
    a plurality of semiconductor die comprising integrated circuits formed in the first major surface of the wafer, in active areas of the semiconductor die;
    a kerf area comprising first and second sets of kerf lines surrounding the active areas of the plurality of semiconductor die; and
    a plurality of corner recesses formed into the first major surface of the wafer, at intersections of the first and second sets of kerf lines;
    wherein a corner recess of the plurality of corner recesses is formed to a depth which is less than a thickness of the semiconductor wafer after the semiconductor wafer is thinned to its final thickness.

2. The semiconductor wafer of claim 1, wherein a portion of the corner recess is left in a plurality of adjacent semiconductor die upon dicing of the plurality of semiconductor die from each other.

3. The semiconductor wafer of claim 2, wherein the portion of the corner recess in a semiconductor die prevents damage to a corner of the semiconductor die after dicing of the semiconductor die and before the semiconductor die is affixed within a semiconductor package.

4. The semiconductor wafer of claim 1, wherein a corner recess of the plurality of corner recesses is located within an intersection of first and second kerf lines of the first and second sets of kerf lines, an area of the corner recess being less than the intersection area defined by the intersection of the first and second kerf lines.

5. The semiconductor wafer of claim 1, wherein a corner recess of the plurality of corner recesses is located within an intersection of first and second kerf lines of the first and second sets of kerf lines, an area of the corner recess being approximately equal to an area defined by the intersection of the first and second kerf lines.

6. The semiconductor wafer of claim 1, wherein a corner recess of the plurality of corner recesses has one of a square and circular shape.

7. A semiconductor die formed from a semiconductor wafer, the semiconductor die comprising:
 a first major surface;
 a second major surface opposed to the first major surface, wherein the second major surface includes an active area and a border;
 an active area including integrated circuits; and
 one or more recess portions formed within an inactive area at the border not including the active area, and at one or more corners where sides of the semiconductor die come together, the one or more recess portions provided to prevent damage to the semiconductor die within the active area;
 wherein the one or more recess portions are formed to a depth which is less than a thickness of the semiconductor die.

8. The semiconductor die of claim 7, wherein the one or more recess portions comprise four recess portions at four corners of the semiconductor die.

9. The semiconductor die of claim 7, wherein the semiconductor die is a flash memory semiconductor die.

10. A semiconductor package, comprising:
 two or more stacked memory die, a semiconductor die of the stacked memory die comprising:
  a first major surface,
  a second major surface opposed to the first major surface,
  an active area including integrated circuits, the integrated circuits formed at the first major surface,
  a border, around the active area, forming an inactive area devoid of integrated circuits, and
  one or more recess portions formed within the inactive area and at one or more corners where sides of the semiconductor die come together, the one or more recess portions provided to prevent damage to the semiconductor die within the active area; and
 a controller die electrically connected to the stacked memory die for controlling the transfer of data to and from the stacked memory die;
 wherein the one or more recess portions of the semiconductor die are formed to a depth which is less than a thickness of the semiconductor die.

11. The semiconductor package of claim 7, wherein the one or more recess portions comprise four recess portions at four corners of the semiconductor die.

12. The semiconductor package of claim 7, wherein the semiconductor die is a NAND memory semiconductor die.

13. A method of fabricating a plurality of semiconductor die within a wafer, the method comprising:
 (a) defining positions of the plurality of semiconductor die on the wafer;
 (b) forming a plurality integrated circuits at a first major surface of the wafer, and within active areas of the plurality of semiconductor die;
 (c) forming a plurality of recesses, less than full thickness of the wafer, at boundaries between the active areas and at corners between adjacent active areas;
 (d) dicing the plurality of semiconductor die to at least partially separate the plurality of semiconductor die from the wafer, a portion of a recess of the plurality of recesses being positioned at a corner of a semiconductor die of the plurality of semiconductor die; and
 (e) backgrinding the plurality of semiconductor die, the portion of the recess at the corner of the semiconductor die preventing other semiconductor die from contacting the corner of the semiconductor die.

14. The method of claim 13, wherein the step (c) of forming a plurality of recesses comprises the step of forming the plurality of recesses using a laser.

15. The method of claim 13, wherein the step (c) of forming a plurality of recesses comprises the step of forming the plurality of recesses using photolithography.

16. The method of claim 13, wherein the step (d) of dicing the semiconductor die comprises the step of performing a stealth dicing before grinding step.

* * * * *